(12) United States Patent
Opris

(10) Patent No.: US 9,417,272 B1
(45) Date of Patent: Aug. 16, 2016

(54) BINARY CODED, ARBITRARILY SHAPED RECEIVED SIGNAL STRENGTH INDICATOR

(71) Applicant: Ion E. Opris, San Jose, CA (US)

(72) Inventor: Ion E. Opris, San Jose, CA (US)

(\*) Notice: Subject to any disclaimer, the term of this patent is extended or adjusted under 35 U.S.C. 154(b) by 450 days.

(21) Appl. No.: 14/102,648

(22) Filed: Dec. 11, 2013

(51) Int. Cl.
  *H03M 1/34* (2006.01)
  *G01R 21/00* (2006.01)
  *G06F 17/50* (2006.01)

(52) U.S. Cl.
  CPC ............ *G01R 21/00* (2013.01); *G06F 17/5072* (2013.01)

(58) Field of Classification Search
  CPC . H03M 1/0646; H03M 1/1019; H03M 1/363; H03M 7/00; G11C 27/026; G01R 21/00; G06F 17/5072
  USPC .................. 341/158, 155, 120, 156
  See application file for complete search history.

(56) References Cited

U.S. PATENT DOCUMENTS

| 7,605,739 | B2 * | 10/2009 | Sutardja | H03M 1/363 341/155 |
| 7,760,127 | B2 * | 7/2010 | Sutardja | H03M 1/1019 341/155 |
| 8,085,180 | B2 * | 12/2011 | Barrow | H03M 1/0646 341/158 |
| 2003/0184459 | A1 * | 10/2003 | Engl | G11C 27/026 341/120 |

* cited by examiner

*Primary Examiner* — Jean B Jeanglaude

(57) ABSTRACT

A received signal strength indicator (RSSI) receives an input voltage. The input voltage is amplified by a cascade of voltage amplifiers. The output of each amplifier is squared by a squarer. The output of each squarer is then compared to an array of fixed values from a strictly monotonic sequence. The comparators outputs are fed to a digital thermometer decoder, the outputs of which represent the binary coded, arbitrarily shaped RSSI. The squarer can be implemented using two MOS transistors, and has a current output. The comparators can be implemented using multiple current mirrors.

11 Claims, 6 Drawing Sheets

US 9,417,272 B1

BINARY CODED, ARBITRARILY SHAPED RECEIVED SIGNAL STRENGTH INDICATOR

BACKGROUND

This invention relates to the field of electronic signal processing, and more specifically to a received signal strength indicator (RSSI) with an arbitrarily shaped transfer function.

An RSSI circuit measures the instantaneous power of a time-varying electrical signal, usually a voltage.

RSSI circuits usually comprise a voltage squarer, followed by a low-pass filter which removes the spectral content located at twice the modulating frequency and above. The output of the RSSI is usually a voltage, proportional to the instantaneous power of the input signal. Hence, these circuits provide a linear relationship between the output and the power of the input signal. In many applications, it is however desirable to obtain a non-linear such relationship. In the art logarithmic amplifiers are known, which shape the input power by a logarithmic transfer function, which is a particular case of a non-linear function. It is desirable to create a circuit which shapes the power of the input signal according to an arbitrary monotonic function. A conventional solution uses an A/D converter which digitizes the linear RSSI, and then applies to it an arbitrary transfer function in the digital domain. This solution has the drawback of complexity and high power consumption, since both the analog RSSI circuit and the A/D must have a full-scale high enough to handle signals covering the entire required dynamic range, and a resolution such that it is able to discriminate the smallest difference required by the transfer function.

It would be desirable, therefore, to create an arbitrarily shaped RSSI circuit which does not require a high-resolution ADC and uses low power.

SUMMARY

Aspects of the invention include a circuit comprising a cascade of voltage amplifiers. A cascade of RSSI blocks, each RSSI block being connected to the output of one of the voltage amplifiers. The output of each RSSI block is a current which is further compared to each current from a range of currents. The results of these comparisons are digital signals which are fed into a digital thermometer decoder. The output of the digital thermometer decoder represents binary code of the arbitrarily shaped RSSI.

BRIEF DESCRIPTION OF THE DRAWINGS

The foregoing aspects and advantages of the present invention will become better understood upon reading the following detailed description and upon reference to the drawings where.

DETAILED DESCRIPTION OF PREFERRED EMBODIMENTS

The following description illustrates the present invention by way of example and not necessarily by way of limitation. Any reference to an element is understood to refer to at least one element. A set of elements is understood to include one or more elements. Any recited connection is understood to encompass a direct operative connection or an indirect operative connection through intermediary structure(s).

Figure 1:
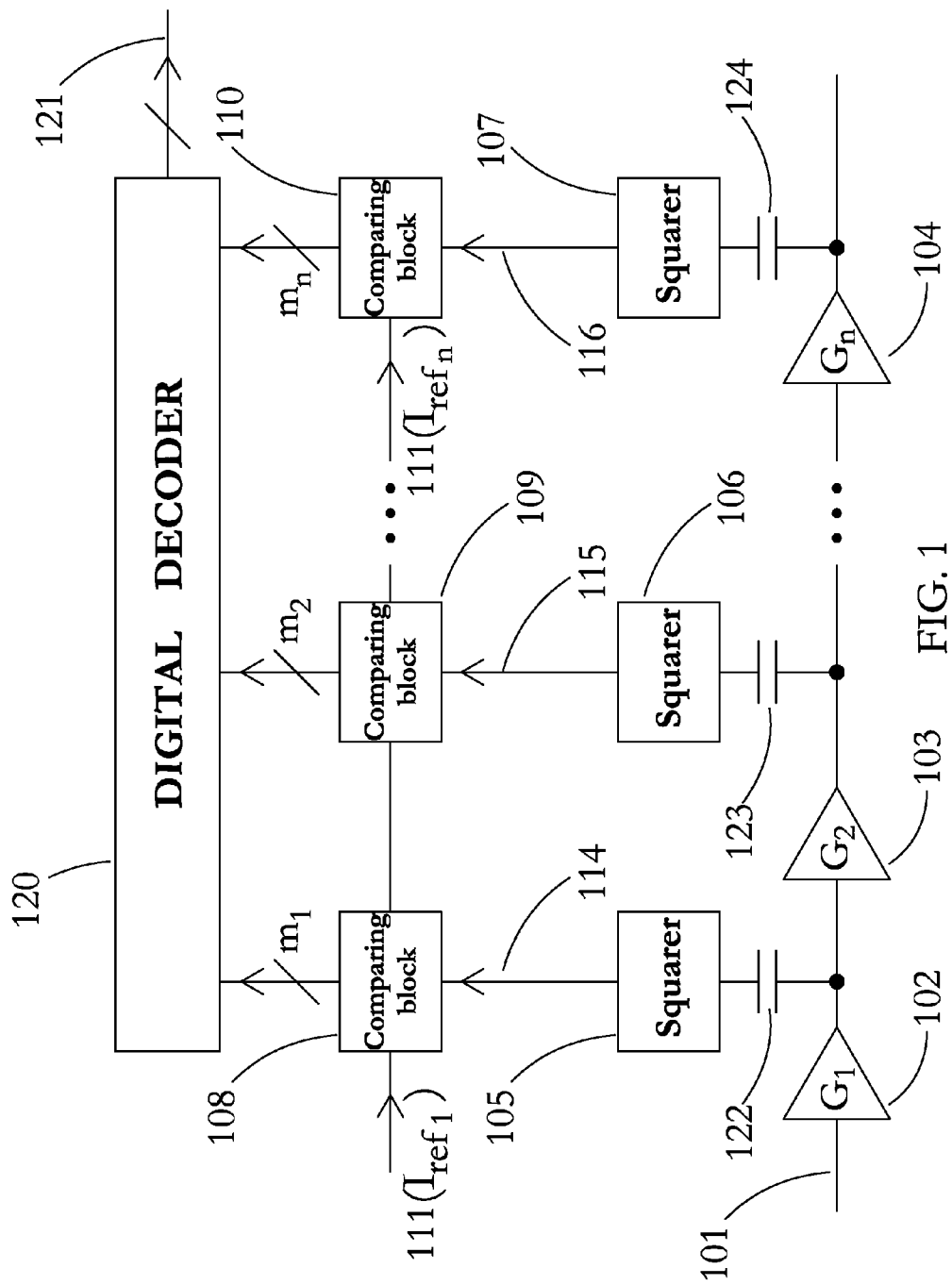
FIG. 1 shows the block diagram of an arbitrarily shaped RSSI circuit, according to some embodiments of the invention.

FIG. 1 shows the block diagram of an arbitrarily shaped RSSI circuit. The input voltage 101 is amplified by a cascade of n voltage amplifiers (102, 103, 104), each voltage amplifier having a gain voltage Gi. The output of each voltage amplifier is applied to a squarer circuit (105, 106, 107). The squarers must be responsive only to the AC content of the input, hence the signals coming from the amplifiers must be DC-blocked (122, 123, 124). The output of each of the squarer circuits is a signal S (114, 115, 116), which can be a current or a voltage. If the instantaneous voltage at the input of a squarer is Vin, then the output of the squarer is: S=SConstant+Prop*Vin*Vin, where SConstant and Prop are constants depending upon the particular implementation of the squarer. The output of each squarer is applied to a comparing block, the i-th comparing block comprising an array of mi individual comparators, wherein in the j-th said individual comparator of the i-th comparing block, the input signal S is compared to a fixed value Sij. The Sij fixed values are strictly increasingly monotonic within each comparing block, and from one comparing block to the next right comparing block. This can be expressed mathematically:

$$S_{11} < S_{12} < \ldots < S_{1,m_1} < S_{21} < S_{22} < \ldots < S_{2,m_1} < \ldots$$
$$< S_{n1} < S_{n2} < \ldots < S_{n,m_j}$$

The outputs of the comparing blocks are digital signals. These outputs of the comparing blocks are applied to a digital thermometer decoder. The output of the thermometer decoder is therefore a digital, binary-coded representation of the arbitrarily shaped RSSI circuit.

In the art, a digital thermometer decoder is a digital block having an array of inputs and an array of outputs. It is required that the signals presented at the array of inputs must be all logic one up to a certain index, and then all zero. The output of the thermometer decoder then indicates the highest index of an input which is a logic one. For example, if the input is 000011111, then the output is 0101.

Also referring to FIG. 1, the fixed values Sij are chosen such that the numbers (Sij−Sconstant)/Gi/Gi approximate the desired transfer function of the arbitrarily shaped RSSI target curve. The said numbers (Sij−Sconstant)/Gi/Gi must be adjusted accordingly if the n squarers are not identical.

Also referring to FIG. 1, it will be clear to an artisan that the squarers 105, 106, 107 will provide an accurate and useful representation of the power of the input signal only if the said input signal is a "baseband" one, in the sense of not being modulated in amplitude. If the input signal is modulated in amplitude and the circuit is desired to output the RSSI of the modulating signal ("envelope"), then a low-pass filter must be included between each squarer and each comparing block connected to the said squarer.

Also referring to FIG. 1, it will be clear to an artisan that the squarers 105, 106, 107 must be accurate only in the range of outputs Si1 to Si,mi. However, the said squarers must be monotonic over the entire range of the input signal.

Also referring to FIG. 1, in some embodiments the voltage amplifiers 102, 103, 104 will be differential (having a differential input and a differential output) and the squarers 105, 106, 107 will have a differential input.

Figure 2:
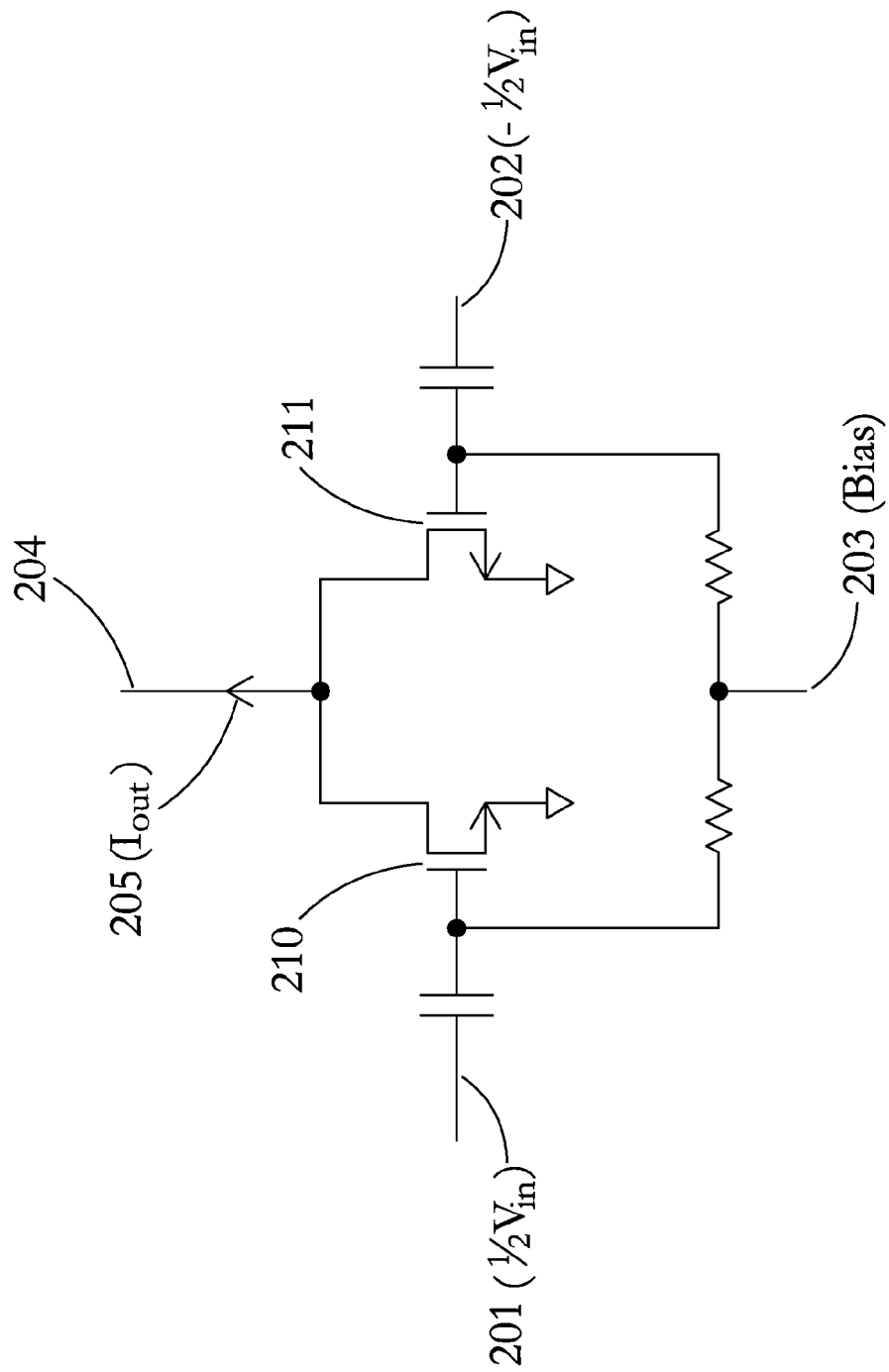
FIG. 2 shows the schematic of a voltage squarer, according to some embodiments of the invention.

FIG. 2 shows the schematic of a squarer. In this embodiment, the squarer is implemented using NMOS transistors. A similar embodiment is using PMOS transistors instead. The differential input voltage between pins 201, 202 is AC-coupled to the gates of 210, 211. Transistors 210 and 211 are DC-biased into the saturation zone, hence exhibiting an instantaneous drain current which is substantially a quadratic function of its gate voltage. The instantaneous output current 205 can then be described by: Iout=IConstant+Prop*Vin*Vin.

Figure 3:
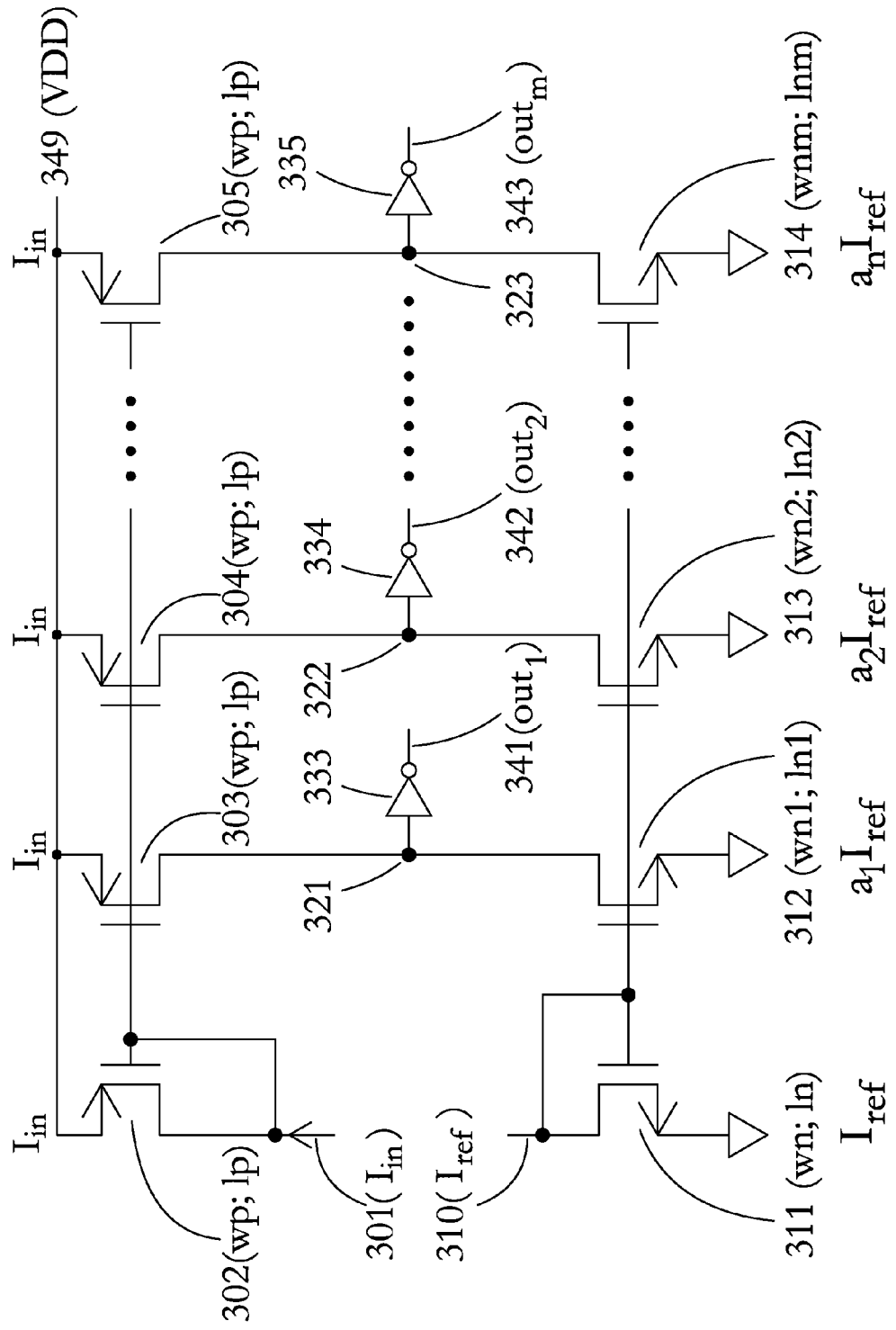
FIG. 3 shows the schematic of an array of current comparators, according to some embodiments of the invention.

FIG. 3 shows the schematic of a comparing block. The input current 301 is mirrored m times by transistors 303, 304, 305 using unitary mirroring coefficients. A reference current 310 is mirrored m times by transistors 312, 313, 314 using mirroring coefficients (a1, a2, an) proportional to Si1, Si2, . . . Si,mi (for the i-th comparing block). In FIG. 3, the mirroring coefficients are obtained by designing accordingly the dimensions (width and length) of the mirroring transistors. In other embodiments, multiple mirroring or other techniques known in the art may be used.

Also referring to FIG. 3, the drain currents flowing from each transistor 303, 304, 305 copying the input current are compared to the drain current from a transistor 312, 313, 314 mirroring the reference current. A current comparator is thus implemented, having as output the common voltage of the two drains. The digital outputs 341, 342, 343 are obtained after the inverters 333, 334, 335.

Also referring to FIG. 3, it is clear that the current mirrors can be cascoded, or realized with other techniques known in the art.

Figure 4:
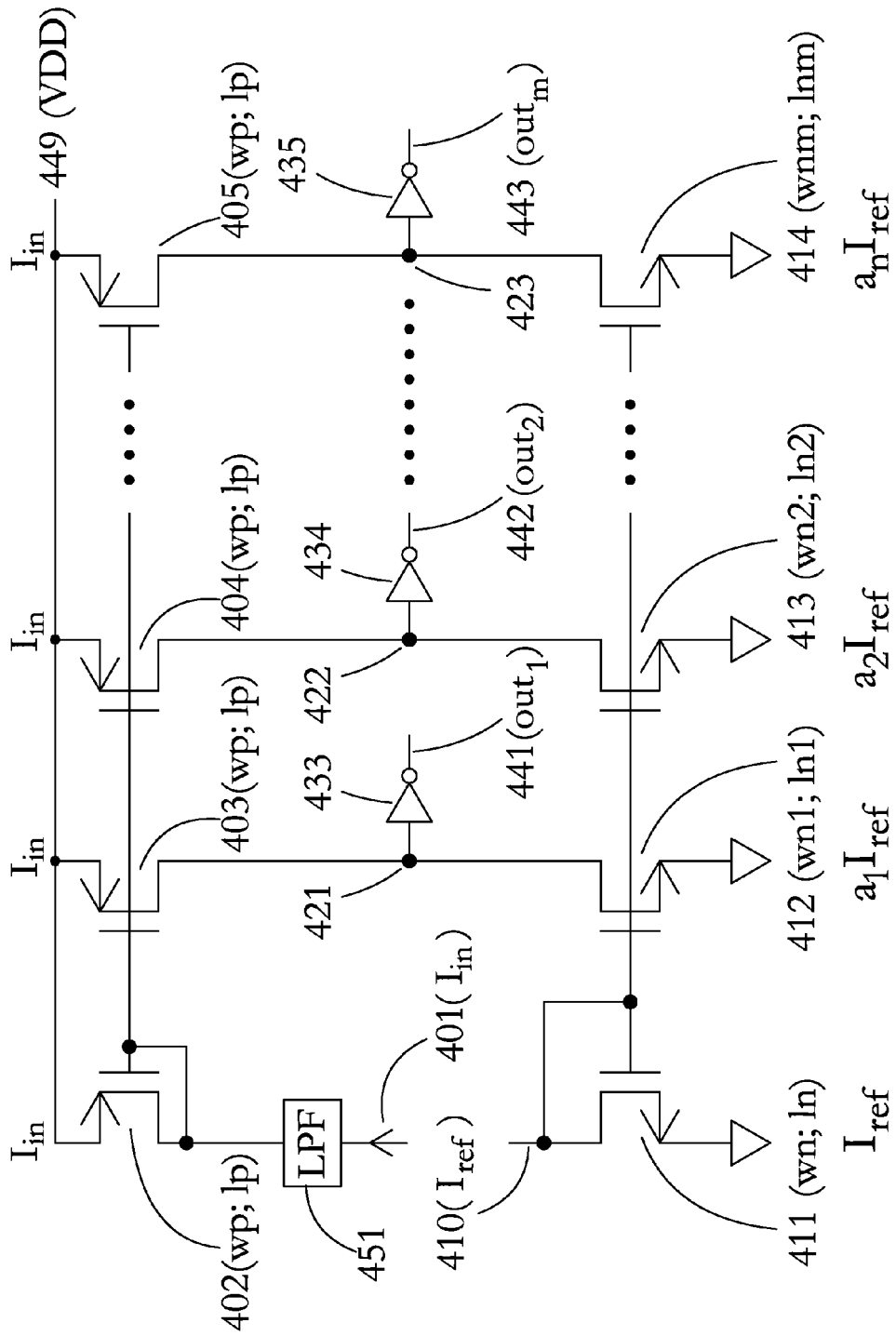
FIG. 4 shows the schematic of an array of current comparators, comprising a low-pass filter coupled to the input current, according to some embodiments of the invention.
Figure 5:
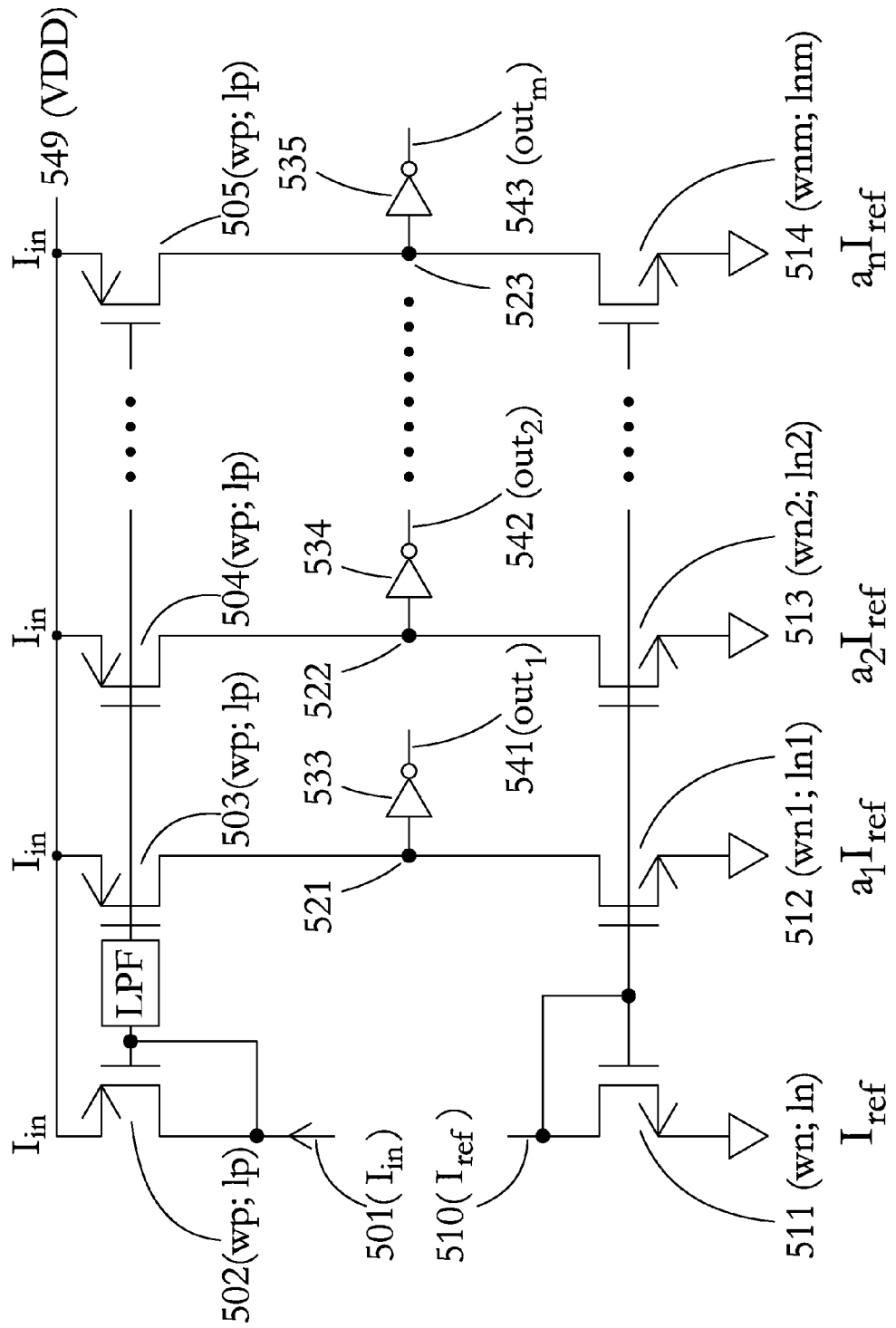
FIG. 5 shows the schematic of an array of current comparators, comprising a low-pass filter coupled to a current mirror mirroring the input current, according to some embodiments of the invention.

If the input signal 101 is amplitude-modulated and it is desired to determine the RSSI of the modulating signal, then the input current 301 of FIG. 3 must be averaged. In one embodiment shown in FIG. 4, the current 401 is passed through the low-pass filter 451. In another embodiment shown in FIG. 5, since it is sometimes difficult to design a current low-pass filter, the low-pass filter 551 can be applied to the voltage of the gate of the transistor 502. The disadvantage of the solution from FIG. 5 is that the currents mirrored by transistors 503, 504, 505, are no longer exact representations of the average of the input current 501; however, in many applications the error such made can be tolerable.

It will be clear to a skilled artisan that the inventions disclosed in FIGS. 2-5 can be implemented using complementary type transistors (PMOS instead of NMOS, and NMOS instead of PMOS).

Figure 6:
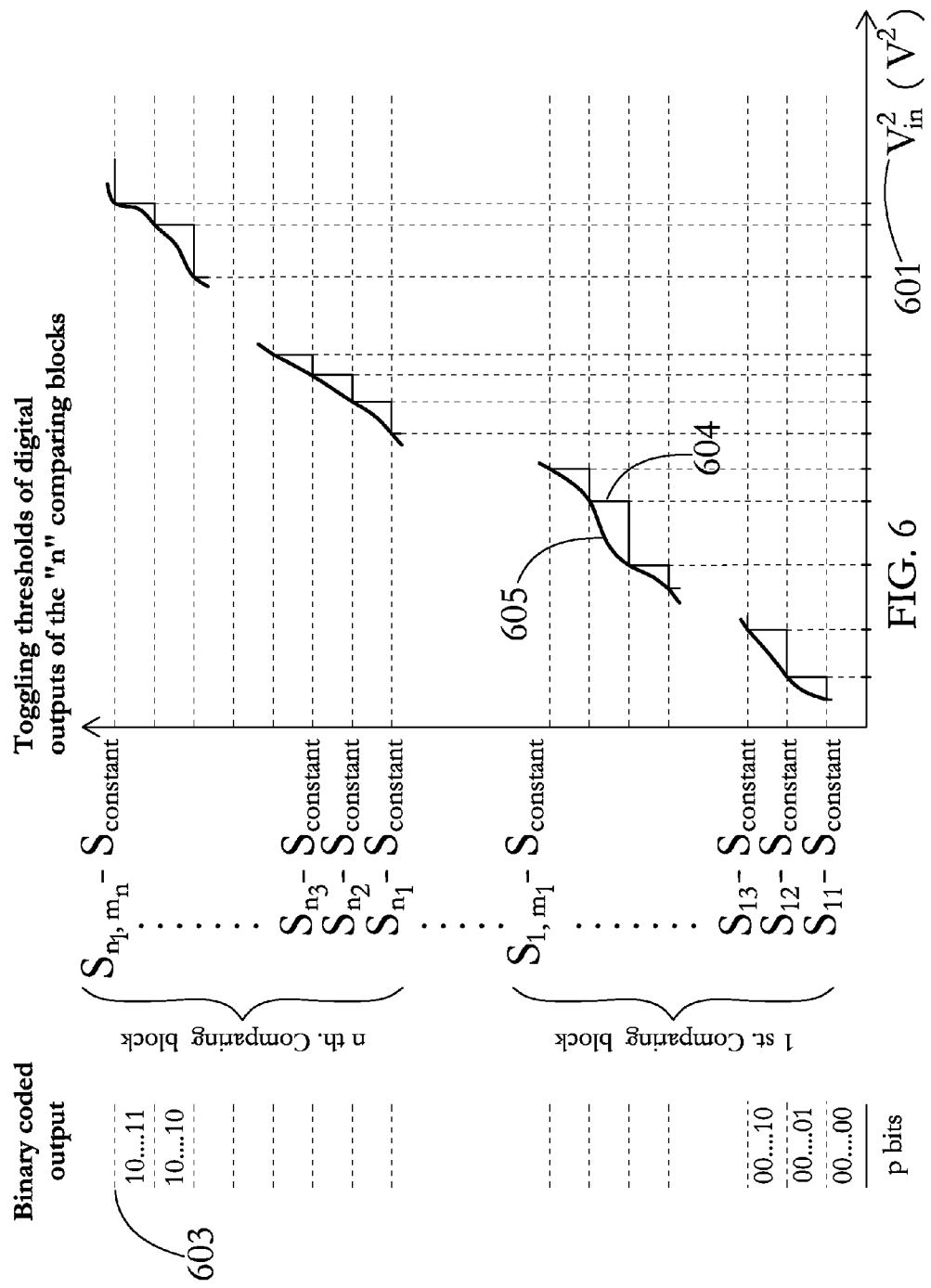
FIG. 6 shows the transfer function of the binary coded, arbitrarily shaped RSSI circuit.

FIG. 6 shows the transfer function of the binary coded, arbitrarily shaped RSSI circuit disclosed in FIG. 1. The x axis (601) depicts the squared voltage of the input signal if the said input signal is not-amplitude modulated ("baseband"), or the squared voltage of the amplitude-modulating signal ("envelope") otherwise. On the y axis the toggling thresholds of the digital outputs of the n comparing blocks are shown (602). The binary coded output 603 is also shown. The staircase transfer function 604 is an approximation of the desired, arbitrarily shaped function 605.

It will be clear to one skilled in the art that the above embodiments may be altered in many ways without departing from the scope of the invention. Accordingly, the scope of the invention should be determined by the following claims and their legal equivalents.

What is claimed is:

1. A binary coded, arbitrarily shaped received signal strength indicator circuit comprising:
    an input of said circuit;
    a binary-coded digital output;
    an array of cascaded voltage amplifiers, wherein said input of said circuit is connected to the input of the first amplifier;
    an array of signal squarers, having as many squarers as voltage amplifiers, wherein an output of each voltage amplifier is connected to an input of one, and only one, squarer;
    an array of comparing blocks, having as many comparing blocks as squarers, wherein each comparing blocks comprises:
        an input, connected to one, and only one, squarer output;
        an array of comparators, wherein each comparator compares a representation of said input of the comparing block to a fixed value, wherein all the fixed values form a strictly increasing sequence; and
        an array of digital outputs, having as many digital outputs as comparators, each said digital output being connected to the output of a comparator;
    a digital thermometer decoder, comprising:
        an array of inputs, having as many inputs in the array as comparators in the entire circuit, wherein each said digital output of each comparing block is connected to an input of the digital thermometer decoder; and
        an array of outputs; and
    an array of outputs of said received signal strength indicator, wherein each said output is connected to an output from the array of the digital thermometer outputs.

2. The received signal strength indicator from claim 1, wherein said representation of the input of each comparing block is said input of the comparing block.

3. The received signal strength indicator from claim 1, wherein said representation of the input of each comparing block is substantially equal to the average of the said input of the comparing block.

4. A binary coded, arbitrarily shaped received signal strength indicator circuit comprising:
    a differential input of said circuit;
    a binary-coded digital output;
    an array of cascaded voltage amplifiers having differential inputs and outputs, wherein said input of said circuit is connected to the input of the first amplifier;
    an array of signal squarers, having as many squarers as voltage amplifiers, each squarer having a differential input and a single-ended output, wherein the output of each voltage amplifier is connected to the input of one, and only one, squarer, each squarer comprising:
        a pair of MOS transistors, the gate of each transistor being coupled through a series capacitor to one of the differential squarer inputs, the sources of the two MOS transistors are connected together and are further connected to a node having a constant voltage, while the drains of the two transistors are connected together and are further connected to the single-ended output of the squarer; and
        a voltage biasing node, which biases through series resistors the gates of the two MOS transistors such that the two MOS transistors operate in the saturation zone;

an array of comparing blocks, having as many comparing blocks as squarers, wherein each comparing blocks comprises:
  an input, connected to one, and only one, squarer output;
  a first circuit having an input and an output, the input of the first circuit being connected to the input of the comparing block;
  a first current mirror having one input and an array of current outputs, wherein the input of the current mirror is connected to the output of the first circuit, while the gate of the mirrored, common source transistor and the gates of the mirroring, common source transistors are connected through a second circuit;
  a second current mirror having one input connected to a reference current, and an array of current outputs having fixed values;
  an array of comparators, wherein each comparator compares one current from the array of outputs of the first mirror with one current from the array of outputs of the second mirror; and
  an array of digital outputs, having as many digital outputs as comparators, each said digital output being connected to the output of a comparator;
a digital thermometer decoder, comprising:
  an array of inputs, having as many inputs in the array as comparators in the entire circuit, wherein each said digital output of each comparing block is connected to an input of the digital thermometer decoder; and
  an array of outputs; and
an array of outputs of said received signal strength indicator, wherein each said output is connected to an output from the array of the digital thermometer outputs.

5. The received signal strength indicator from claim 4, wherein said first circuit inside each comparing block is a direct connection, and said second circuit inside each comparing block is a direct connection.

6. The received signal strength indicator from claim 4, wherein said first circuit inside each comparing block is a low-pass filter, and said second circuit inside each comparing block is a direct connection.

7. The received signal strength indicator from claim 4, wherein said first circuit inside each comparing block is a direct connection, and said second circuit inside each comparing block is a low-pass filter.

8. A method to build a binary coded, arbitrarily shaped received signal strength indicator circuit comprising:
  a first step in which a desired, arbitrarily shaped received signal strength indicator curve is approximated by a sequence of contiguous binary coded numbers, each number being associated with a certain squared voltage of the input signal;
  a second step in which a voltage squaring circuit having an input and an output is built, a minimum and maximum input voltage is determined for which said squaring circuit provides an output substantially close to the desired square function, and the ratio between said maximum and minimum input voltages raised to power two, is determined, and further a minimum and maximum output voltage corresponding to said minimum and maximum input voltages are determined;
  a third step in which said sequence of numbers is partitioned into an array of compact partitions, such that within each partition the ratio between the highest and the lowest number is lower than said ratio determined in step two;
  a fourth step in which each partition from step three is mapped onto a range of output signals, said signals having values in the range bound by the minimum and the maximum output voltages from step two, and further mapped onto a range of input signals;
  a fifth step in which an array of comparing blocks is built, having as many blocks as partitions, wherein each comparing blocks comprises:
    an input;
    an array of comparators, wherein each comparator compares a representation of said input of the comparing block to each value from said mapped range of output signals from step four; and
    an array of digital outputs, having as many digital outputs as comparators, each said digital output being connected to the output of a comparator;
  a sixth step in which a digital thermometer decoder is built, the decoder comprising:
    an array of inputs, having as many inputs in the array as comparators in the entire circuit, wherein each said digital output of each comparing block is connected to an input of the digital thermometer decoder; and
    an array of outputs;
  a seventh step in which an array of voltage squaring circuits from step two is built, having as many squaring circuits as partitions from step three, wherein the output of each voltage squaring circuit is connected to the input of a comparing block; and
  an eighth step in which an array of cascaded voltage amplifiers, having as many voltage amplifiers as voltage squaring circuits, wherein the output of each voltage amplifier is connected to the input of each voltage squaring circuit, and each voltage from the sequence of input signals is amplified to a signal equal to a value from the range of input signals from step four.

9. The method from claim 8, wherein said representation of the input of said comparing block from step five is substantially equal to said input of said comparing block from step five.

10. The method from claim 8, wherein said representation of the input of said comparing block from step five is substantially equal to the temporal average of said comparing block from step five.

11. The method from claim 8, wherein:
  the voltage squaring circuit from step two comprises two MOS transistors, having the drains connected together, the output of the voltage squaring circuit being the sum of the two MOS drain currents, the sources connected together and further connected to an electrical node having a substantially constant voltage, and the input of the voltage squaring circuit is a differential voltage, each node of said differential input being applied through a series capacitor to the gate of one, and only one, of the two MOS transistors;
  each of the comparators from step five comprises a first current source outputting a current being substantially equal to the output current of the voltage squaring circuit, a second current source substantially equal to the output range of mapped signals from step four, and the first and the second current sources have their outputs connected together and further connected to the output of the comparator.

\* \* \* \* \*